United States Patent [19]

Cheney

[11] 3,798,466

[45] Mar. 19, 1974

[54] CIRCUITS INCLUDING COMBINED FIELD EFFECT AND BIPOLAR TRANSISTORS

[75] Inventor: Glen Trenton Cheney, Allentown, Pa.

[73] Assignee: Bell Telephone Laboratories, Incorporated, Murray Hill, Berkeley Heights, N.J.

[22] Filed: Mar. 22, 1972

[21] Appl. No.: 237,046

[52] U.S. Cl. .................................. 307/205, 307/251

[51] Int. Cl. .......................................... H03k 19/08

[58] Field of Search ........... 307/205, 251, 279, 303, 307/304

[56] References Cited

UNITED STATES PATENTS

| | | | |
|---|---|---|---|
| 3,601,628 | 8/1971 | Redwine | 307/304 |
| 3,601,630 | 8/1971 | Redwine | 307/205 |
| 3,631,528 | 12/1971 | Green | 307/251 |
| 3,649,843 | 3/1972 | Redwine | 307/205 |
| 3,636,372 | 1/1972 | Hujita | 307/251 |
| 3,553,541 | 1/1971 | King | 307/303 |
| 3,582,975 | 6/1971 | King | 307/279 |
| 3,586,989 | 6/1971 | Wheable | 307/251 |

*Primary Examiner*—Rudolph V. Rolinec
*Assistant Examiner*—Ro E. Hart
*Attorney, Agent, or Firm*—R. B. Anderson

[57] ABSTRACT

The output signal of a BIGFET is increased by connecting an auxiliary IGFET between the bias source and the output. The gate of the auxiliary IGFET is actuated by the input signal. Current through the BIGFET is periodically controlled to permit voltage "pull-up" by the auxiliary IGFET.

7 Claims, 2 Drawing Figures

CIRCUITS INCLUDING COMBINED FIELD EFFECT AND BIPOLAR TRANSISTORS

BACKGROUND OF THE INVENTION

This invention relates to integrated circuits, and more particularly, to integrated circuit modules comprising combined bipolar and IGFET transistors.

Field effect transistors normally comprise source and drain regions on an upper surface of a semiconductor wafer and interconnected by a channel region. A gate electrode overlying the channel region controls current through the channel between the source and drain, thereby to perform such useful functions as amplification and switching. Because current conduction is by carriers of a single polarity, field effect transistors are often known as unipolar devices to distinguish them from conventional transistors, known as bipolar devices. They are also known by the abbreviated form FET: and, if the gate electrode is insulated from the channel layer, they are known as IGFET devices (for insulated gate field effect transistor).

An important form of integrated circuit module comprises bipolar and IGFET transistors in which the drain region of the IGFET also constitutes the base region of the bipolar transistor. Integrated circuit modules of this type, sometimes known as bipolar-IGFETS, or BIGFETS, are described for example, in the U. S. Pat. Of J. E. Price No. 3,264,493, issued Aug. 2, 1966; the U. S. Pat. of E. F. King No. 3,553,541, issued Jan. 5, 1971; and the U. S. Pat. of E. F. King No. 3,582,975, issued June 1, 1971, the latter two being assigned to Bell Telephone Laboratories, Incorporated. As pointed out in these references, BIGFET circuit modules have a number of advantages as, for example, their simplicity and compatibility with integrated circuit fabrication techniques. Because they have a high input impedance and a low output impedance, they are useful as interface circuits between components having different impedance characteristics.

For certain applications, a component known as a buffer-driver is required as an interface module for transferring digital signals from one IGFET logic circuit to another. While a BIGFET module is often desirable for this purpose, especially when high speed is required and large capacitances exist at the interface, problems have been encountered when the logic circuits involved are fabricated using low threshold voltage, ($V_t$~−1.0 volts) p-channel IGFETS. For applications of this type it has been found that a conventional BIGFET module does not provide a sufficiently high positive logic 1 level to allow adequate noise margin for spurious signals which may occur at the interface.

SUMMARY OF THE INVENTION

Accordingly, it is an object of this invention to increase the voltage level of the output 1 signal of a BIGFET circuit module, without degrading the 0 signal.

This and other objects of the invention are attained in a BIGFET module comprising an auxiliary IGFET between the bias source and the output. More specifically, the auxiliary IGFET source is connected to the bias source, the IGFET drain is connected to the bipolar transistor emitter, and the auxiliary IGFET gate is connected to the BIGFET input. The BIGFET is an inverting module; that is, the transferred data are inverted in polarity such that an input 1 digit is transferred from the output as a 0, while an input 0 digit is manifested as an output 1.

As will become clear later, an input digital 0 causes the auxiliary IGFET to conduct current from the bias source to the BIGFET output, which increases the amplitude of the output 1 pulse. This insures that a succeeding low threshold voltage logic circuit correctly interprets the output signal as a logic 1 even in the presence of normal noise signals which are commonly encountered in electronic systems. In accordance with another feature of the invention, current through the bipolar transistor of the BIGFET is controlled by a discharge IGFET, to permit satisfactory operation of the auxiliary or "pull-up" IGFET. The discharge IGFET is controlled by a gating signal which advantageously may be taken from the clock source of a shift register or other clocked IGFET circuit that precedes the BIGFET.

The precise manner in which these elements cooperate will, of course, be better understood from the following detailed description. It will be seen that the invention adds little to the cost of the circuit since IGFET devices are easily incorporated into the module, and that no modification need be made of bias source voltages, clock source voltages or the like. In effect, the needed "pull-up" of the output 1 digit is made without the requirement for any new input energy sources or energy source modifications.

These and other objects, features and advantages of the invention will be better understood from a consideration of the following detailed description taken in conjunction with the accompanying drawing.

DRAWING DESCRIPTION

FIG. 1 is a schematic view of a BIGFET circuit module in accordance with an illustrative embodiment of the invention; and FIG. 2 is a series of graphs of various voltages versus time at certain locations in the circuit module of FIG. 1.

DETAILED DESCRIPTION

Figure 1:
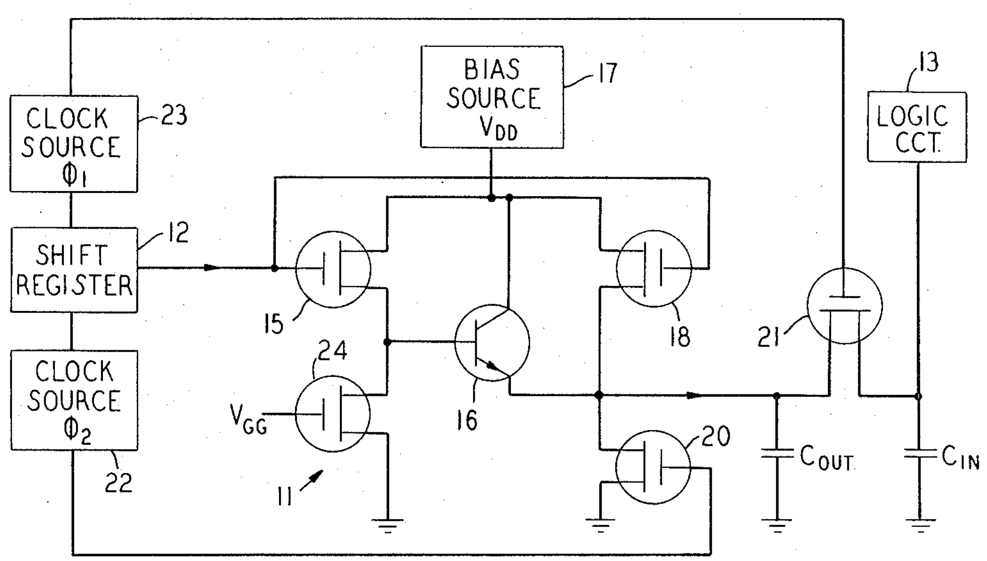

Referring now to FIG. 1 there is shown schematically a BIGFET circuit module 11 which is used as an interface module between an IGFET shift register or other IGFET logic circuit 12 and a logic circuit 13. As is known, BIGFET circuits are favored as interface modules because of their high input impedance, low output impedance, and high current output. Of equal importance is the ease with which they can be fabricated on a single semiconductor wafer by known integrated circuit techniques.

The BIGFET module comprises an IGFET device 15 having a drain region directly connected to the base region of a bipolar transistor 16. As is known, the BIGFET is conveniently made by making the IGFET 15 such that its diffused drain region also constitutes the base region of transistor 16. The BIGFET module and interconnections have an output capacitance schematically shown as capacitance $C_{out}$ and is connected to a logic circuit 13, the logic circuit having an input capacitance shown as $C_{in}$. The BIGFET module as shown constitutes an inverter as well as an interface circuit; that is, a signal transmitted by the circuit 12 to the BIGFET circuit as a digital 1 is transferred to the logic circuit 13 as a digital 0 and vice versa.

The problem with which this invention is concerned is that, while the current and impedance characteristics of the BIGFET circuit 11 may be optimum, the output voltage of each digital 1 may not be sufficiently high. This is particularly true if the logic circuit 13 is a p-channel IGFET circuit using a fabrication technology which produces low threshold voltage (such as $V_t \sim -1.0_v$), in which case, with optimum input voltages, the output voltage of a digital 1 may not be sufficiently high to avoid being erroneously interpreted as a 0, especially if noise signals often encountered in electronic systems are present. For example, an output 1, in the absence of modification, would typically be ($V_{DD}$−1.0 volt), where $V_{DD}$ is the voltage of bias source 17. A logic level 1.0 volts below $V_{DD}$ may be unacceptable as a logic 1 input into a low threshold voltage p-channel IGFET device.

This problem is overcome by providing an auxiliary IGFET 18 to "pull-up" the voltage of any digital 1 output, without appreciably affecting the current or impedance characteristics of the BIGFET circuit 11. A convenient way to accomplish this aim successfully is to control the emitter load impedance of transistor 16 with a gating signal. The control function is preferably accomplished by IGFET 20 having its gate electrode connected to clock source 22. The clock sources 22 and 23 are those required by an IGFET shift register or other IGFET logic circuit 12 for its conventional operation; thus, additional signal sources are not required.

Figure 2:
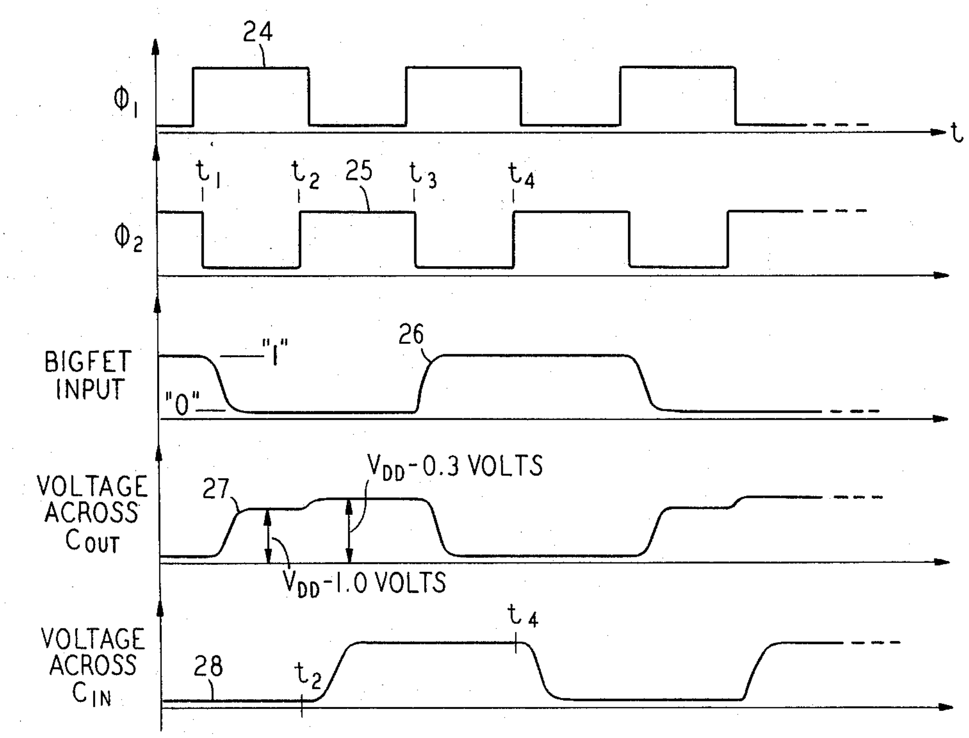

The operation of the BIGFET circuit can best be described with reference to FIG. 2 which is a number of voltage versus time graphs at various locations in the circuit. Curves 24 and 25 respectively illustrate the output of clock sources 23 and 22. Curve 26 is a graph of the voltage delivered by circuit 12 to the gate electrode of IGFET 15. Curves 27 and 28 are graphs of the voltage across $C_{out}$ and $C_{in}$, respectively.

The clock source voltages having phases $\phi_1$ and $\phi_2$ control information transfer out of circuit 12 such that information becomes available at the BIGFET input when $\phi_2$ (curve 25) goes negative. For example, at time $t_1$, when $\phi_2$ begins to go negative, the BIGFET input voltage may change from an input 1 condition to an input 0 condition as shown (curve 26). This means that between time $t_1$ and $t_2$ an input 0 is being transferred to the BIGFET circuit.

When p-channel enhancement IGFETs are connected as shown in FIG. 1, and with $V_{DD}$ applying a positive voltage to the IGFET substrates, a low gate voltage causes IGFET conduction and a high gate voltage prevents conduction. Thus, between time $t_1$ and $t_2$, IGFET 20 is conducting and IGFET 21 is non-conducting.

The input 0 likewise causes IGFET 15 and transistor 16 to conduct, thus generating an output current and a voltage across $C_{out}$ as shown by curve 27. The output voltage across $C_{out}$ is typically equal to the voltage $V_{DD}$ of source 17 minus losses across IGFET 15 and transistor 16; as shown, the BIGFET output voltage may typically be $V_{DD}$ minus approximately 1.0 volts. As mentioned before, this may not constitute a sufficiently high voltage output 1.

The input 0 also turns on auxiliary IGFET 18 which couples bias source 17 to the output. Thus, at time $t_2$, when IGFET 20 ceases conduction, current from conducting IGFET 18 charges $C_{out}$ to a voltage near that of bias source 17. Typically, the voltage across $C_{out}$ is increased to ($V_{DD}$ −0.3) volts as shown by curve 27 of FIG. 2. Shortly after time $t_2$, the gate voltage $\phi_1$ of IGFET 21 goes negative as shown by curve 24, and IGFET 21 becomes conducting so as to charge the input capacitance $C_{in}$ to substantially the voltage of $C_{out}$. The voltage across $C_{in}$ is shown by curve 28, and the high voltage occurring after time $t_2$ of course constitutes the digit 1 transferred from the BIGFET to logic circuit 13. The voltage for this digit has, of course, been increased in accordance with the invention.

Notice that when IGFET 20 is conducting, a path is established through bipolar 16 and the $C_{out}$ voltage is determined by $V_{DD}$ minus the relatively large voltage drop across bipolar 16 and IGFET 15; whereas, when IGFET 20 is non-conducting, the $C_{out}$ voltage is determined by $V_{DD}$ minus the small voltage drop across auxiliary IGFET 18.

The succeeding digit at the BIGFET input becomes available between times $t_3$ and $t_4$, wherein the phase $\phi_2$ (curve 25) is negative and IGFET 20 is again conducting. Assume that the new input digit is a 1 as shown by curve 26 at time $t_3$. IGFETs 15 and 18 and transistor 16 will be non-conducting, and capacitor $C_{out}$ will be discharged through IGFET 20 as illustrated by curve 27. Shortly after time $t_4$, phase $\phi_1$ (curve 24) goes negative to make IGFET 21 conducting, thereby causing $C_{in}$ to discharge into capacitance $C_{out}$. This causes the voltage across $C_{in}$ to decay as shown by curve 28, thereby causing a digital 0 to be transferred to logic circuit 13, shortly after time $t_4$. $C_{out}$ is typically much larger than $C_{in}$ in the course of normal design, so that when IGFET 21 is turned on, $C_{in}$ assumes the potential stored by $C_{out}$.

IGFET 24 operates in a known manner to provide a discharge path for the base of bipolar 16 when IGFET 15 is non-conducting. In effect, it is a convenient integrated circuit alternative for a discharge resistor.

The modifications made to the BIGFET interface module do not change its basic characteristics or impair its operation. IGFET 20 may be a large-geometry, low-impedance device, since it does not load the shift register and thereby does not slow data transmittal. The circuit module speed is high because transistor 16 charges $C_{out}$ very rapidly due to its high current drive capabilities. IGFET 18 may be a relatively small device which does not substantially increase the capacitive load on the shift register.

It is of course contemplated that most of the digital energy for a 1 is transmitted by the bipolar transistor 16, with only a small proportion needed for voltage "pull-up" being transmitted by IGFET 18. For this, the combination of the transconductance $g_m$ of IGFET 15, the common emitter current gain $\beta$ of bipolar 16 and the impedance of IGFET 20 should be sufficiently high. Normally, the current gain of bipolar transistor 16 is sufficiently high (typically greater than 50) to assure a high voltage drop across IGFET 20 between times $t_1$ and $t_2$, even if no particular pains are taken to makes the impedance of IGFET 20 high. Of course, the impedance of IGFET 18 should be kept sufficiently low to provide adequate "pull-up" of the output voltage.

In summary, it can be appreciated that modifications have been described for pulling up the output voltage of a transmitted 1 digit of a BIGFET without appreciably disturbing the high speed or impedance characteristics of the BIGFET module. Switching functions to accomplish this may conveniently be controlled by clock sources that are required for IGFET shift register and other IGFET logic circuits and are external to the BIGFET module. A specific switching circuit has been described and its operation discussed in detail; it is to be understood, however, that various other circuit modifications could be employed for accomplishing the same function in accordance with the invention.

Various other embodiments and modifications may be made by those skilled in the art without departing from the spirit and scope of the invention.

What is claimed is:

1. In a BIGFET circuit of the type comprising a first IGFET device having source, gate and drain regions, a bipolar transistor having emitter, collector and base regions, means comprising a bias source connected to the bipolar transistor collector region for biasing the bipolar transistor, the first IGFET drain region being connected to the bipolar base region, means for applying an input digital signal to the first IGFET gate region, and means for deriving an output digital signal from the bipolar emitter region, the improvement comprising:

a second IGFET device having a gate region connected, by way of a completely passive transmission line, to the gate of the first IGFET, a source region connected to the bipolar transistor collector region, and a drain region connected to the emitter of the bipolar transistor;

and means for periodically changing the emitter load impedance of the bipolar transistor and for periodically altering the current path through the bipolar transistor comprising a third IGFET device having a source region connected to the drain region of the second IGFET device, a drain region connected to a reference potential, and a gate region connected to a periodic switching means.

2. The improvement of claim 1 further comprising:

an output capacitance $C_{out}$ associated with the output of the BIGFET circuit;

and wherein the third IGFET device comprises means for periodically discharging the capacitance $C_{out}$ to a reference potential.

3. The improvement of claim 2 wherein:

the BIGFET output is coupled to a load having an input capacitance $C_{in}$;

and further comprising a fourth IGFET for periodically altering the potential across capacitance $C_{in}$ by transmitting charge between $C_{out}$ and $C_{in}$.

4. The improvement of claim 3 wherein:

the third IGFET and fourth and IGFET devices are actuated by first and second clock sources having a pulse output of the same frequency but of a different phase.

5. The improvement of claim 4 wherein: an input of the BIGFET is connected to a logic circuit; and said first and second clock sources constitute clock sources for said logic circuit.

6. The improvement of claim 5 wherein:

the first and second clock sources generate pulsed outputs that are substantially 180 degrees out-of-phase.

7. The improvement of claim 5 wherein:

the logic circuit is a shift register.

* * * * *